United States Patent
He et al.

(10) Patent No.: US 9,966,961 B1
(45) Date of Patent: May 8, 2018

(54) PIN ALLOCATION CIRCUIT

(71) Applicant: NXP USA, INC., Austin, TX (US)

(72) Inventors: Yedong He, Suzhou (CN); Zhihong Wang, Suzhou (CN)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/702,750

(22) Filed: Sep. 12, 2017

(30) Foreign Application Priority Data

May 11, 2017 (CN) .......................... 2017 1 0332124

(51) Int. Cl.
    *H01L 25/00* (2006.01)
    *H03K 19/177* (2006.01)
    *H03K 19/173* (2006.01)

(52) U.S. Cl.
    CPC ... *H03K 19/17744* (2013.01); *H03K 19/1732* (2013.01); *H03K 19/1737* (2013.01)

(58) Field of Classification Search
    CPC ......... H03K 19/17744; H03K 19/1732; H03K 19/1737
    USPC .......................................................... 326/41
    See application file for complete search history.

(56) References Cited

U.S. PATENT DOCUMENTS

| | | | |
|---|---|---|---|
| 5,225,719 A * | 7/1993 | Agrawal | H03K 19/17704 326/114 |
| 6,057,705 A | 5/2000 | Wojewoda et al. | |
| 7,285,980 B2 | 10/2007 | Bansal et al. | |
| 7,693,003 B2 | 4/2010 | Chu | |
| 7,894,283 B2 | 2/2011 | Freebern et al. | |
| 8,813,015 B2 | 8/2014 | Vaduvatha et al. | |
| 2017/0125115 A1 * | 5/2017 | Jang | G11C 16/32 |

* cited by examiner

*Primary Examiner* — Daniel D Chang
(74) *Attorney, Agent, or Firm* — Charles E. Bergere

(57) ABSTRACT

A system on chip (SoC) is connected to multiple off-chip devices, where the off-chip devices share IO pads of the SoC. A pin-mux circuit is used to facilitate the IO pad sharing. The pin-mux circuit can be addressed using just one control register and a decoder, which allows the IO pads to be easily and flexibly assigned. The decoder generates pin-mux control bits based on a configuration word stored in the control register. The pin-mux circuit assigns IO pads of the SoC to the off-chip devices. Device controllers of the SoC provide output bits to corresponding ones of the devices by way of the IO pads, and the devices provide input bits to the device controllers via the IO pads. Chip area is saved by using a register-decoder scheme, and set-up requires writing just the one control register.

20 Claims, 4 Drawing Sheets

US 9,966,961 B1

PIN ALLOCATION CIRCUIT

BACKGROUND

The present invention relates generally to integrated circuits, and more particularly, to an adaptive pin allocation circuit for integrated circuits.

Many integrated circuits (ICs) such as processors and Systems on a Chip (SoC) are connected to external devices such as random access memory (RAM), wireless communication systems, a camera, and the like by way of input/output (IO) pins. The IO pins are connected to corresponding IO pads of the IC or SoC. Herein SoC will be used to connote both processors and SoCs. The SoC includes multiple device controllers corresponding to the external or off-chip devices that facilitate communication between the off-chip devices and a processor of the SoC.

An off-chip device may transmit to and receive data from a corresponding device controller using multiple IO pads. However, since the SOC will have a limited number of IO pins, it is more efficient to have some devices share IO pins, such that multiple off-chip devices communicate with the SOC using the same IO pins. When off-chip devices share an IO pin, the SoC uses a pin multiplexing circuit (hereinafter a "pin-mux circuit") to facilitate the sharing of the pad.

A conventional pin-mux circuit includes a multiplexer, a demultiplexer, and a register. The off-chip devices are connected to the SoC with multiple pins and their corresponding IO pads. The SoC includes multiple pin-mux circuits that correspond to the multiple IO pads. Each pin-mux circuit includes a corresponding register, which stores a MUX select word corresponding to one of the IO pads. A multiplexer is connected to the device controllers and receives data bits from the controllers. The multiplexer also receives the MUX select word as a select signal from the register. The multiplexer outputs a data bit corresponding to a device and a device controller based on the MUX select word. The device corresponding to the device controller then receives the data bit by way of the IO pad.

A demultiplexer is connected to the multiple devices by way of the IO pad and receives data bits from the multiple devices. The demultiplexer also receives the MUX select word as a select signal from the register. The demultiplexer outputs a data bit from a device to a corresponding device controller based on the MUX select word. The SoC includes multiple such pin-mux circuits corresponding to the multiple IO pads for communicating with the multiple devices, and each of the pin-mux circuits includes a corresponding register for storing a corresponding MUX select word.

Typically, the MUX select word is written to the register using a C language command. For example, if the SoC includes two hundred IO pads, then two hundred C language commands are written to the corresponding two hundred registers to configure the two hundred pin-mux control circuits. The large number of registers results in a large area overhead, and the large number of write commands wastes processing time.

U.S. Pat. No. 8,813,015 discloses a SoC having multiple IO pads, where the SoC is connected to a memory device by way of the IO pads. An allocation register is used to allocate IO pads to input bits. The allocation register receives the input bits from various on-chip and off-chip devices, and outputs the input bits to the memory device by way of the IO pads based on multiple control signals. Multiple registers are needed to store the multiple control signals. The allocation register includes multiple multiplexers corresponding to the multiple IO pads. The multiplexers receive the control signals from the registers.

In one instance, the SoC includes N IO pads ($P_1$-$P_n$). Hence, the allocation register includes N multiplexers ($M_1$-$M_n$) corresponding to the N IO pads. Each multiplexer receives N input bits ($I_1$-$I_n$), and the corresponding control signal ($C_1$-$C_n$). For example, a multiplexer M1 outputs one input bit of the N input bits based on its corresponding control signal $C_1$. The corresponding IO pad $P_1$ receives the control signal $C_1$. Since there are N control signals, the SoC includes N registers. Multiple registers required for allocation of the N input bits to the N IO pads increases the area of the SoC. Further, the SoC requires N commands to allocate the N input bits to the N IO pads, which uses excessive processor time to configure the registers.

It would be advantageous to have an SoC with pin-mux circuits that use fewer registers and requires fewer commands to configure the registers.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
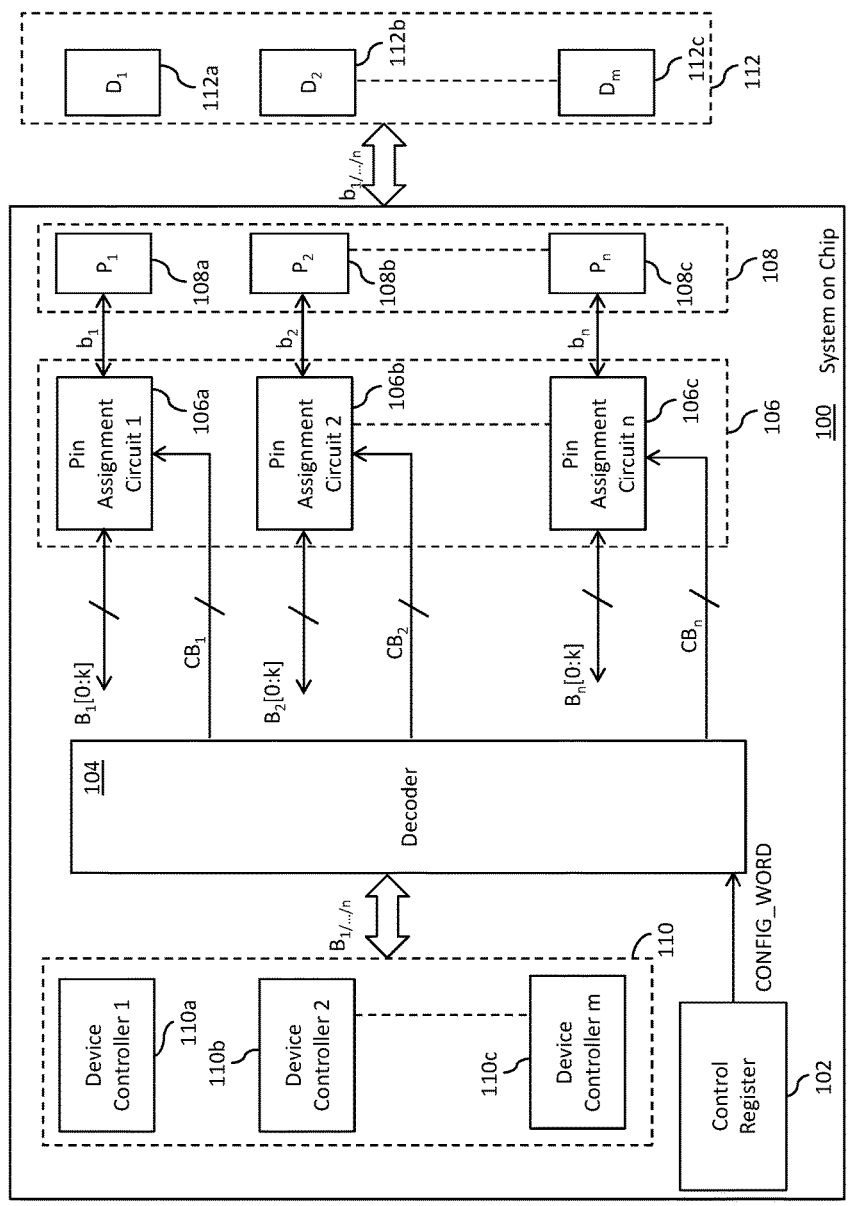
FIG. 1 is a schematic block diagram of a system on chip (SoC) connected to multiple devices in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In one embodiment, the present invention comprises a system on chip (SoC) that includes a control register, a decoder, a set of device controllers, a set of IO pads, and a set of pin assignment circuits. The SoC is connected to a set of off-chip or external devices by way of the set of IO pads. The control register stores a set of configuration words, where a configuration word corresponds to a subset of the set of devices. The set of devices generates a corresponding set of input bits. The decoder is connected to the control register. The decoder receives the configuration word and generates a set of pin-mux control bits based on the configuration word. The set of device controllers generates a corresponding set of output bits. The set of device controllers corresponds to the set of devices. The set of IO pads is connected to the set of devices, and each IO pad performs one of inputting and outputting the sets of input and output bits, respectively. The set of pin assignment circuits is connected to the decoder, receives the set of pin-mux control bits, and assigns one or more IO pads of the set of IO pads to the subset of the set of devices based on the set of pin-mux control bits. The set of pin assignment circuits corresponds to the set of IO pads. A device controller of the set of device controllers transmits an output bit of the set of output bits to a corresponding device of the subset of the set of devices by way of the one or more IO pads of the set of IO pads. A device of the subset of the set of devices transmits an input bit of the set of input bits to the corresponding device controller of the set of device controllers by way of the one or more IO pads of the set of IO pads.

In another embodiment, the present invention comprises a method for assigning one or more IO pads of a set of IO pads of a SoC to a subset of a set of devices. The SoC includes a control register, a decoder, a set of device controllers, a set of IO pads, and a set of pin assignment circuits. The method includes storing a set of configuration words in a control register, where a configuration word corresponds to a subset of the set of devices. The method further includes receiving the configuration word of the set of configuration words from the control register by a decoder, and generating a set of pin-mux control bits by the decoder based on the received configuration word. The method further includes transmitting the set of pin-mux control bits to a set of pin assignment circuits by the decoder, and assigning one or more IO pads of the set of IO pads by the set of pin assignment circuits based on the set of pin-mux control bits to the subset of the set of devices. The set of IO pads corresponds to the set of pin assignment circuits. The method further includes generating a set of output bits by a corresponding set of the device controllers. The method further includes transmitting an output bit of the set of output bits by a device controller of the set of device controllers by way of the one or more IO pads of the set of IO pads to a device of the subset of the set of devices. The method further includes transmitting an input bit of a set of input bits by the device of the subset of the set of devices by way of the one or more IO pads of the set of IO pads to the corresponding device controller of the set of device controllers. Each device of the set of devices generates a corresponding input bit of the set of input bits.

In yet another embodiment, the present invention provides a SOC connected to a plurality of devices, where the devices generate a plurality of input bits. The SOC comprises a control register that stores a configuration word that corresponds to the plurality of devices. A decoder is connected to the control register for receiving the configuration word, and generating a plurality of pin-mux control bits based on the configuration word. A plurality of device controllers corresponding to the plurality of devices generate a plurality of output bits to be transmitted to the plurality of devices. A set of IO pads is connected to the plurality of devices, wherein each IO pad performs at least one of receiving one of the input bits and outputting one of the output bits. A plurality of pin assignment circuits is connected to the decoder for receiving the pin-mux control bits. The pin assignment circuits assign the IO pads of the set of IO pads to the devices based on the set of pin-mux control bits. The device controllers transmit the plurality of output bits to the corresponding ones of the devices of the plurality of devices by way of the assigned IO pads, and the devices transmit the plurality of input bits to the corresponding ones of the device controllers by way of the assigned IO pads. Further, each pin assignment circuit includes a first multiplexer, a filter and a demultiplexer. The first multiplexer is connected to the device controllers and the decoder, and receives the output bits from the device controllers and a subset of the pin-mux control bits from the decoder, and outputs the output bits to corresponding IO pads of the set of IO pads based on the subset of the pin-mux control bits. The filter is connected to the corresponding IO pads and the decoder, and receives one or more of the input bits and the subset of the pin-mux control bits, respectively, and outputs one of a plurality of filtered input bits and the received one or more input bits, based on the subset of the pin-mux control bits. The demultiplexer is connected to the filter and the decoder, and receives one or more of the input bits of the plurality of input bits, the one or more filtered input bits, and the subset of the set of pin-mux control bits, and outputs one of the one or more input bits and the one or more filtered input bits based on the subset of the set of pin-mux control bits.

Various embodiments of the present invention provide an integrated circuit, including an SOC or a processor. Although this specification is written in terms of the invention comprising a SoC, it will be apparent to those of skill in the art that the invention is equally applicable to a processor and so the invention is not limited to a SoC. The SoC includes a control register, a decoder, a set of device controllers, a set of IO pads, and a set of pin assignment circuits. The SoC is connected to a set of devices, which corresponds to the set of device controllers. One or more devices of the set of devices function simultaneously to perform an application. The control register stores a configuration word corresponding to the application. The decoder receives the configuration word from the control register and generates a set of pin-mux control bits based on the configuration word. The set of pin assignment circuits receives the set of pin-mux control bits from the decoder. The set of pin assignment circuits assigns one or more IO pads of the set of IO pads to the one or more devices of the set of devices based on the set of pin-mux control bits. The set of devices generates a corresponding set of input bits. The set of device controllers generates a corresponding set of output bits. The one or more devices transmit the corresponding one or more input bits of the set of input bits to one or more device controllers of the set of device controllers by way of the one or more IO pads based on the set of pin-mux control bits. The one or more device controllers transmit one or more output bits of the set of output bits to the one or more devices of the set of devices by way of the one or more IO pads based on the set of pin-mux control bits.

Since the control register stores the configuration words for configuring all the pin assignment circuits by way of the decoder, the SoC consumes less area than a conventional pin assignment circuit. Further, the use of a single control register reduces the number of C language commands needed to configure the pin assignment circuits, to just one command. This results in reduced processing load and reduced processing time.

Referring now to FIG. 1, a schematic block diagram of a SoC 100 in accordance with an embodiment of the present invention is shown. The SoC 100 includes a control register 102 and a decoder 104. The SoC 100 further includes multiple pin assignment circuits, three of which are shown—first through third pin assignment circuits 106a-106c (collectively referred to as "pin assignment circuits 106"). The SoC 100 further includes multiple input/output (IO pads), three of which are shown—first through third IO pads 108a-108c (collectively referred to as "IO pads 108"). The SoC 100 further includes multiple device controllers, three of which are shown—first through third device controllers 110a-110c (collectively referred to as "device controllers 110"). The SoC 100 is connected to multiple devices, three of which are shown—first through third devices 112a-112c (collectively referred to as "devices 112") by way of IO pins (now shown). The IO pins correspond to the IO pads 108. The devices 112 are peripheral devices such as a random access memory (RAM), a keypad, a universal serial bus (USB), a camera, an Ethernet peripheral device, a digital-to-analog converter (DAC), an analog-to-digital converter (ADC), a speaker, a display device and the like. Each of the devices 112 performs a corresponding application. In an alternate embodiment, multiple combinations of devices 112 perform the application. For example, in a home security system, the camera, the speaker, the keypad, and the display device may operate substantially simultaneously to make the home security system functional.

The control register 102 stores multiple configuration words CONFIG_WORD, where a configuration word CONFIG_WORD corresponds to an application. The configuration word CONFIG_WORD is typically a multi-bit word. The number of bits of the configuration word CONFIG_WORD is a logarithmic function of the number of applications being performed by the devices 112. For example, if the number of applications performed by the devices 112 is sixteen, then the number of bits of the configuration word CONFIG_WORD is four ($Log_2(16)$). Typically, the configuration word CONFIG_WORD preferably is coded into the control register 102 by way of a C language command.

In one embodiment, the SoC 100 is used to control a smart home system. The smart home system includes multiple systems such as an air conditioning system, a lighting system, a security system, an audio-visual system, and the like. The multiple systems perform an application each. In one example, the smart home system performs first through fourth applications by using the air conditioning system, the lighting system, the security system, and the audio-visual system. The first through fourth applications may each employ a combination of the devices 112. For example, the audio-visual system may use a camera, a speaker, and a display device, functioning simultaneously for a smooth operation of the audio-visual system. As the smart home system includes the first through fourth applications, the configuration word CONFIG_WORD has a two-bit value and includes first through fourth binary numbers—00, 01, 10, and 11. The first through fourth binary numbers correspond to the first through fourth applications, respectively.

The devices 112 communicate with the SoC 100 so that a processor (not shown) of the SoC 100 processes data from the devices 112. In the aforementioned example, the camera transmits data such as image, video, and audio data to the SoC 100. The SoC 100 processes and stores the image, video, and audio data therein. The SoC may receive a request to display the video and audio data. Consequently, the SoC 100 transmits the video data to the display device and the audio data to the speaker to fulfill the request.

The device controllers 110 facilitate the communication between the processor of the SoC 100 and the devices 112. The devices 112 use the IO pads 108 to transmit and receive data to and from the device controllers 110. The device controllers 110 generate multiple sets of bits, three of which are shown—first through third sets of bits $B_1[0:k]$-$B_3[0:k]$ (collectively referred to as "sets of bits") for controlling the devices 112, where "k" is a natural number and represents the number of bits in the first through third sets of bits $B_1[0:k]$-$B_3[0:k]$. The decoder 104 is connected to the control register 102 and receives the configuration word CONFIG_WORD therefrom. The decoder 104 generates multiple pin-mux control bits, three of which are shown—first through third pin-mux control bits $CB_1$-$CB_3$ (collectively referred to as "pin-mux control bits") based on the configuration word CONFIG_WORD. In one embodiment, the first through third pin-mux control bits $CB_1$-$CB_3$ each are single bit. In another embodiment, the first through third pin-mux control bits $CB_1$-$CB_3$ each include multiple bits.

The pin assignment circuits 106 are connected to the device controllers 110 and assign one or more pads of the IO pads 108 to the device controllers 110. The first through third pin assignment circuits 106a-106c each receive the first through third sets of bits $B_1[0:k]$-$B_3[0:k]$ from the device controllers 110. The first through third pin assignment circuits 106a-106c are connected to the first through third IO pads 108a-108c, respectively. The first through third pin assignment circuits 106a-106c output first through third bits $b_1$-$b_3$ (collectively referred to as "bits") to the first through third IO pads 108a-108c based on the first through third pin-mux control bits $CB_1$-$CB_3$, respectively. The devices 112 receive the first through third bits $b_1$-$b_3$ by way of the IO pads 108.

Further, the first through third devices 112a-112c transmit the first through third bits $b_1$-$b_3$ to the IO pads 108. The first through third pin assignment circuits 106a-106c receive the first through third bits $b_1$-$b_3$ by way of the first through third IO pads 108a-108c, respectively. The first through third pin assignment circuits 106a-106c transmit the first through third bits $b_1$-$b_3$ to the first through third device controllers 110a-110c based on the first through third pin-mux control bits $CB_1$-$CB_3$, respectively.

Figure 2:
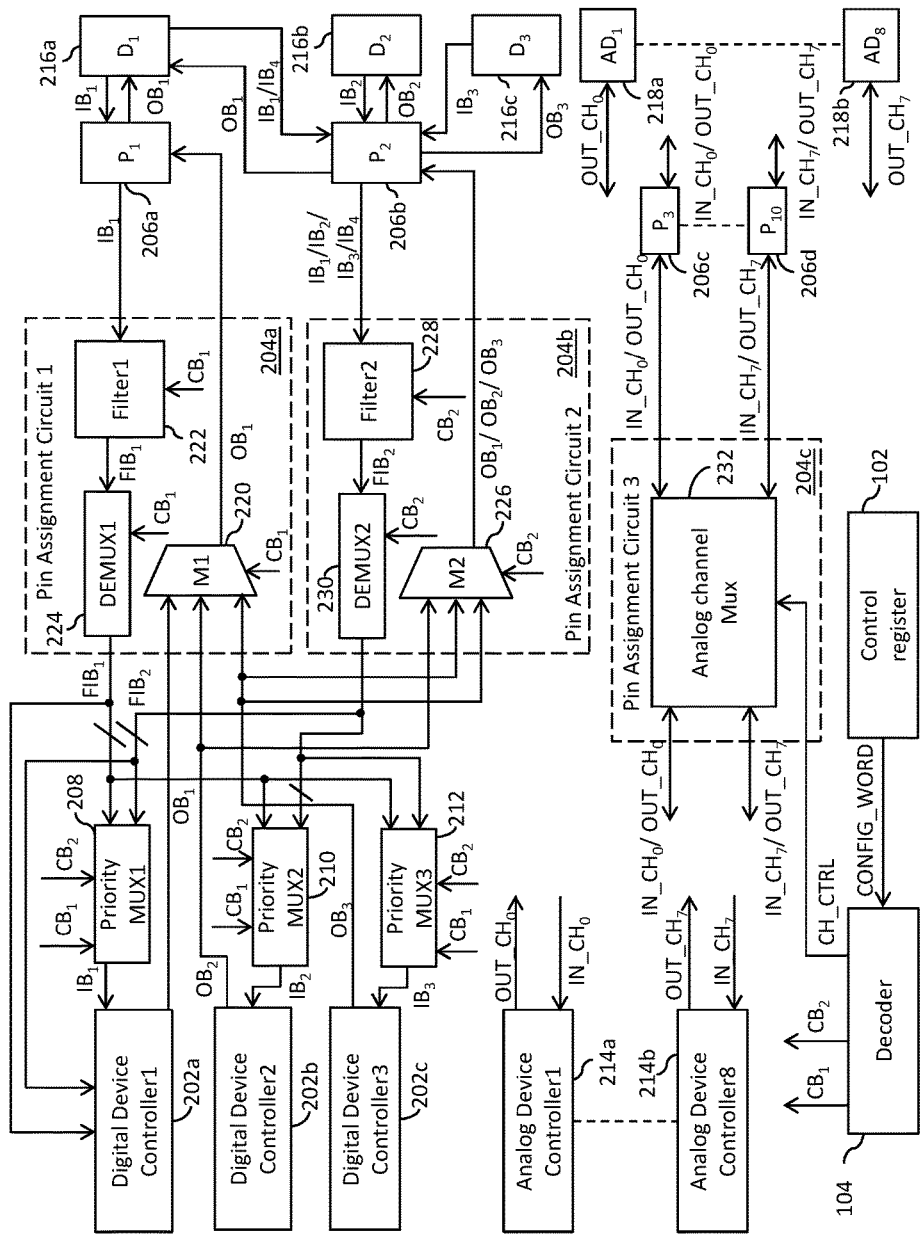
FIG. 2 is a schematic block diagram of a SoC connected to multiple devices in accordance with another embodiment of the present invention.

Referring now to FIG. 2, a schematic block diagram of the SoC 100 in accordance with another embodiment of the present invention is shown. The SoC 100 includes the control register 102, the decoder 104, first through third digital device controllers 202a-202c, first through third pin assignment circuits 204a-204c, first through fourth IO pads 206a-206d, first through third priority muxes 208-212, and multiple analog device controllers, two of which are shown—first and second analog device controllers 214a and 214b (collectively referred to as "analog device controllers" 214). The SoC 100 is connected to first through third digital devices 216a-216c by way of the first and second IO pads 206a and 206b. The SoC 100 is further connected to multiple analog devices, two of which are shown—first and second analog devices 218a and 218b (collectively referred to as "analog devices" 218) by way of the third and fourth IO pads 206c and 206d, respectively. The first pin assignment circuit 204a includes a first mux 220, a first filter 222, and a first demux 224. The second pin assignment circuit 204b includes a second mux 226, a second filter 228, and a second demux 230. The third pin assignment circuit 204c includes an analog channel mux 232.

The first digital device controller 202a is connected to the first priority mux 208, and the first and second pin assignment circuits 204a and 204b. The first pin assignment circuit 204a is connected to the first IO pad 206a. The first digital device 216a is connected to the first and second IO pads 206a and 206b. The second digital device controller 202b is connected to the second priority mux 210 and the first and second pin assignment circuits 204a and 204b. The second pin assignment circuit 204b is connected to the second IO pad 206b. The second digital device 216b is connected to the second IO pad 206b. The third digital device controller 202c is connected to the third priority mux 212 and the first and second pin assignment circuits 204a and 204b. The third digital device 216c is connected to the second IO pad 206b.

The analog device controllers 214 are connected to the third pin assignment circuit 204c. The third pin assignment circuit 204c is connected to the third and fourth IO pads 206c and 206d. The first and second analog devices 218a and 218b are connected to the third and fourth IO pads 206c and 206d, respectively.

The first through third digital device controllers 202a-202c generate first through third output bits $OB_1$-$OB_3$, respectively. In one embodiment, the first digital device controller 202a transmits the first output bit $OB_1$ to the first digital device 216a by way of the first IO pad 206a. The first mux 220 is connected to the decoder 104 and receives the first pin-mux control bit $CB_1$ from the decoder 104. The first mux 220 further receives the first through third output bits $OB_1$-$OB_3$ from the first through third digital device controllers 202a-202c, respectively. In one instance, a value of the first pin-mux control bit $CB_1$ corresponds to the first digital device 216a and, thus, the first mux 220 outputs the first output bit $OB_1$ to the first IO pad 206a. The first digital device 216a receives the first output bit $OB_1$ from the first IO pad 206a.

The first digital device controller 202a may alternately transmit the first output bit $OB_1$ to the first digital device 216a by way of the second IO pad 206b. The second mux 226 receives the first through third output bits $OB_1$-$OB_3$ from the first through third digital device controllers 202a-202c, respectively. The second mux 226 further receives the second pin-mux control bit $CB_2$ from the decoder 104. In one instance, a value of the second pin-mux control bit $CB_2$ corresponds to the first digital device 216a. Thus, the second mux 226 outputs the first output bit $OB_1$ to the second IO pad 206b based on the second pin-mux control bit $CB_2$. The first digital device 216a receives the first output bit $OB_1$ from the second IO pad 206b.

The second and third digital device controllers 202b and 202c transmit the second and third output bits $OB_2$ and $OB_3$ to the second and third digital devices 216b and 216c, respectively, by way of the second IO pad 206b. The second mux 226 is connected to the decoder 104 and receives the second pin-mux control bit $CB_2$ from the decoder 104. The second mux 226 further receives the first through third output bits $OB_1$-$OB_3$ from the first through third digital device controllers 202a-202c, respectively, and outputs one of the first, second and third output bits $OB_1$, $OB_2$ and $OB_3$ to the second IO pad 206b. The second digital device 216b may receive the second output bit $OB_2$ from the second IO pad 206b based on the second pin-mux control bit $CB_2$. Alternately, the third digital device 216c may receive the third output bit $OB_3$ from the second IO pad 206b based on the second pin-mux control bit $CB_2$.

Figure 3:
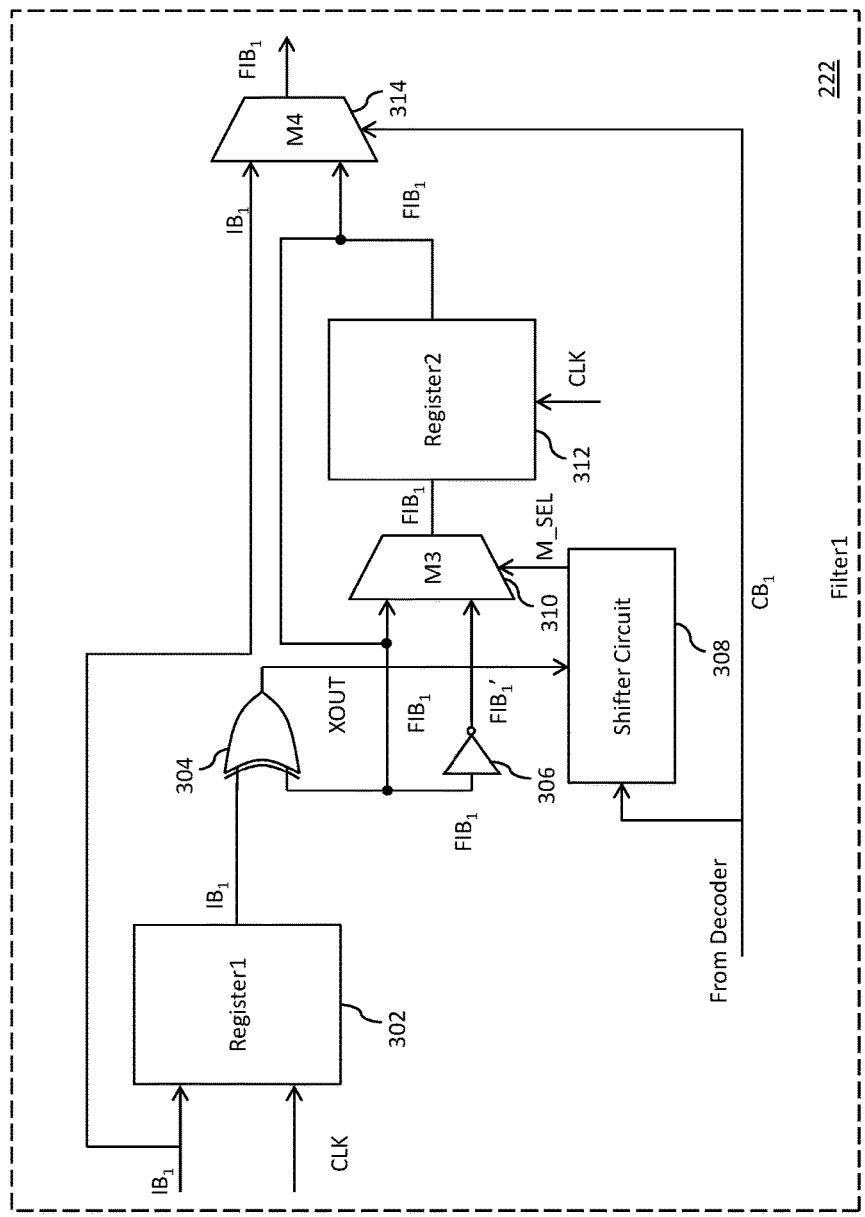
FIG. 3 is a schematic block diagram of a first filter of the SoC of FIG. 2 in accordance with an embodiment of the present invention.

In one embodiment, the value of the first pin-mux control bit $CB_1$ corresponds to the first digital device 216a. The first digital device 216a outputs a first input bit $IB_1$ to the first IO pad 206a. The first filter 222 receives the first input bit $IB_1$ from the first IO pad 206a. FIG. 3 shows a schematic block diagram of the first filter 222 of FIG. 2 in accordance with an embodiment of the present invention. The first filter 222 includes a first register 302, an XOR gate 304, a first NOT gate 306, a shift circuit 308, a third mux 310, a second register 312, and a fourth mux 314. The first register 302 receives the first input bit $IB_1$ and a clock signal CLK from the first IO pad 206a and a clock generator (not shown), respectively. The XOR gate 304 is connected to the first register 302 and the first NOT gate 306. The first NOT gate receives the first filtered input bit $FIB_1$ and generates an inverted first filtered input bit $FIB_1'$. The XOR gate 304 receives the first input bit $IB_1$ from the first register 302 and receives the filtered input bit $FIB_1$ from the second register 312. The XOR gate 304 further outputs an XOR output bit XOUT to the shift circuit 308. The shift circuit 308 is connected to the decoder 104 and receives the first pin-mux control bit $CB_1$. The shift circuit 308 generates a MUX select signal M_SEL and outputs the MUX select signal M_SEL based on the first pin-mux control bit $CB_1$.

The third mux 310 is connected to the first NOT gate 306, the second register 312, and the shift circuit 308 and receives the inverted first filtered input bit $FIB_1'$, the filtered input bit $FIB_1$, and the MUX select signal M_SEL, respectively. The third mux 310 outputs the filtered input bit $FIB_1$ to the second register 312 based on the MUX select signal M_SEL. The fourth mux 314 is connected to the first IO pad 206a and the second register 312, and receives the first input bit $IB_1$ and the first filtered input bit $FIB_1$, respectively. The fourth mux 314 receives the first pin-mux control bit $CB_1$ from the decoder 104 as a select signal. In one instance, the value of the first pin-mux control bit $CB_1$ is such that the fourth mux 314 outputs the first filtered input bit $FIB_1$ based on the first pin-mux control bit $CB_1$. In another instance, the value of the first pin-mux control bit $CB_1$ is such that the fourth mux 314 outputs the first input bit $IB_1$ based on the first pin-mux control bit $CB_1$. The first digital device controller 202a may need one of the first input bit $IB_1$ and the first filtered input bit $FIB_1$ based on the application. The first filter 222 ensures that the first digital device controller 202a receives a correct input, which is either of the first input bit $IB_1$ and the first filtered input bit $FIB_1$ based on the first pinmux control bit $CB_1$.

In the preferred embodiment, the first filter 222 outputs the first filtered input bit $FIB_1$ based on the first pin-mux control bit $CB_1$. The first demux 224 receives the first pin-mux control bit $CB_1$ from the decoder 104 and outputs the first filtered input bit $FIB_1$ to the first priority mux 208. The first priority mux 208 outputs the first filtered input bit $FIB_1$ as the first input bit IB1 to the first digital device controller 202a based on the first and second pin-mux control bits $CB_1$ and $CB_2$.

In another embodiment, the decoder 104 outputs the second pin-mux control bit $CB_2$ such that its value corresponds to the first digital device 216a. The first digital device 216a outputs the first input bit $IB_1$ to the second IO pad 206b. The second filter 228 receives the first input bit $IB_1$ from the second IO pad 206b. The second filter 228 outputs a second filtered input bit $FIB_2$ based on the second pin-mux control bit $CB_2$. The second demux 230 receives the second pin-mux control bit $CB_2$ from the decoder 104 and outputs the second filtered input bit $FIB_2$ including the first input bit $IB_1$ to the first priority mux 208. In one instance, values of the first and second pin-mux control bits $CB_1$ and $CB_2$ are such that the first priority mux 208 outputs the second filtered input bit $FIB_2$ as the first input bit IB1 to the first digital device controller 202a based on the first and second pin-mux control bits $CB_1$ and $CB_2$ as.

In yet another embodiment, the decoder 104 outputs the first and second pin-mux control bits $CB_1$ and $CB_2$ such that both correspond to the first digital device 216a. The first digital device 216a transmits the first input bit $IB_1$ to the first and second IO pads 206a and 206b. The first and second filters 222 and 228 receive the first input bit $IB_1$ from the first and second IO pads 206a and 206b, respectively. The first and second filters 222 and 228 output the first and second filtered input bits $FIB_1$ and $FIB_2$, respectively, based on the first and second pin-mux control bits $CB_1$ and $CB_2$. The first and second demuxes 224 and 230 receive the first and second pin-mux control bits $CB_1$ and $CB_2$, respectively, from the decoder 104 and output the first and second filtered input bits $FIB_1$ and $FIB_2$ to the first priority mux 208. The first priority mux 208 receives the first and second pin-mux control bits $CB_1$ and $CB_2$ from the decoder 104. The first priority mux 208 receives one of the first and second pin-mux control bits $CB_1$ and $CB_2$ at a most significant bit (MSB) slot thereof. In one instance, the first priority mux 208 receives the first pin-mux control bit $CB_1$ at the MSB slot. Then, the first priority mux 208 outputs the first filtered input bit $FIB_1$ as the first input bit IB1 to the first digital device controller 202a based on the first pin-mux control bit $CB_1$. In another instance, the first priority mux 208 receives the second pin-mux control bit $CB_2$ at the MSB slot. Then, the first priority mux 208 outputs the second filtered input bit $FIB_2$ as the first input bit IB1 to the first digital device controller 202a based on the second pin-mux control bit $CB_2$.

In another embodiment, the first digital device 216a transmits the first input bit $IB_1$ and a fourth input bit $IB_4$ to the first and second IO pads 206a and 206b, respectively. The first and second filters 222 and 228 receive the first and fourth input bits $IB_1$ and $IB_4$ from the first and second IO pads 206a and 206b, respectively. The first and second filters 222 and 228 output the first and second filtered input bits $FIB_1$ and $FIB_2$, respectively. The first and second demuxes 224 and 230 receive the first and second pin-mux control bits $CB_1$ and $CB_2$ from the decoder 104 and output the first and second filtered input bits $FIB_1$ and $FIB_2$, respectively. The first digital device controller 202a receives the first filtered input bit $FIB_1$ as the first input bit $IB_1$ from the first demux 224. The first digital device controller 202a receives the second filtered input bit $FIB_2$ as the fourth input bit $IB_4$ from the second demux 230.

The second and third digital devices 216b and 216c are connected to the second IO pad 206b. Either one of the second or third digital devices 216a or 216b output one of the second or third input bits $IB_2$ or $IB_3$, respectively, to the second IO pad 206b. In one instance, a value of the second pin-mux control bit $CB_2$ is such that the second IO pad 206b receives the second input bit $IB_2$ from the second digital device 216b. The second filter 228 receives the second input bit $IB_2$ from the second IO pad 206b. The second filter 228 outputs the second filtered input bit $FIB_2$ to the second demux 230 based on the second pin-mux control bit $CB_2$. The second demux 230 outputs the second filtered input bit $FIB_2$ to the second priority mux 210 based on the second pin-mux control bit $CB_2$. The second priority mux 210 outputs the second filtered input bit $FIB_2$ as the second input bit $IB_2$ to the second digital device controller 202b based on the first and second pin-mux control bits $CB_1$ and $CB_2$.

In another instance, a value of the second pin-mux control bit $CB_2$ is such that the second IO pad 206b receives the third input bit $IB_3$ from the third digital device 216c. The second filter 228 receives the third input bit $IB_3$ from the second IO pad 206b. The second filter 228 outputs the second filtered input bit $FIB_2$ to the second demux 230 based on the second pin-mux control bit $CB_2$. The second demux 230 outputs the second filtered input bit $FIB_2$ to the third priority mux 210 based on the second pin-mux control bit $CB_2$. The third priority mux 210 outputs the second filtered input bit $FIB_2$ as the third input bit $IB_3$ to the third digital device controller 202c based on the first and second pin-mux control bits $CB_1$ and $CB_2$.

The analog device controllers 214 are connected to the third pin assignment circuit 204c, which includes the analog channel mux 232. The analog channel mux 232 receives a channel control signal CH_CTRL from the decoder 104. The analog channel mux 232 is further connected to the third and fourth IO pads 206c and 206d. The third and fourth IO pads 206c and 206d are connected to the first and second analog devices 218a and 218b, respectively.

The analog devices 218 generate first through eighth channel input signals $IN\_CH_0$-$IN\_CH_7$ and output the first through eighth channel input signals $IN\_CH_0$-$IN\_CH_7$ to the analog channel mux 232. In one instance, the first analog device 218a outputs the first channel input signal $IN\_CH_0$ to the analog channel mux 232 by way of the third IO pad 206c. The analog channel mux 232 outputs the first channel input signal $IN\_CH_0$ to the first analog device controller 214a based on the channel control signal CH_CTRL. In another instance, the second analog device 218b outputs the eighth channel input signal $IN\_CH_7$ to the analog channel mux 232 by way of the fourth IO pad 206d. The analog channel mux 232 outputs the eighth channel input signal $IN\_CH_7$ to the second analog device controller 214b based on the channel control signal CH_CTRL.

Figure 4:
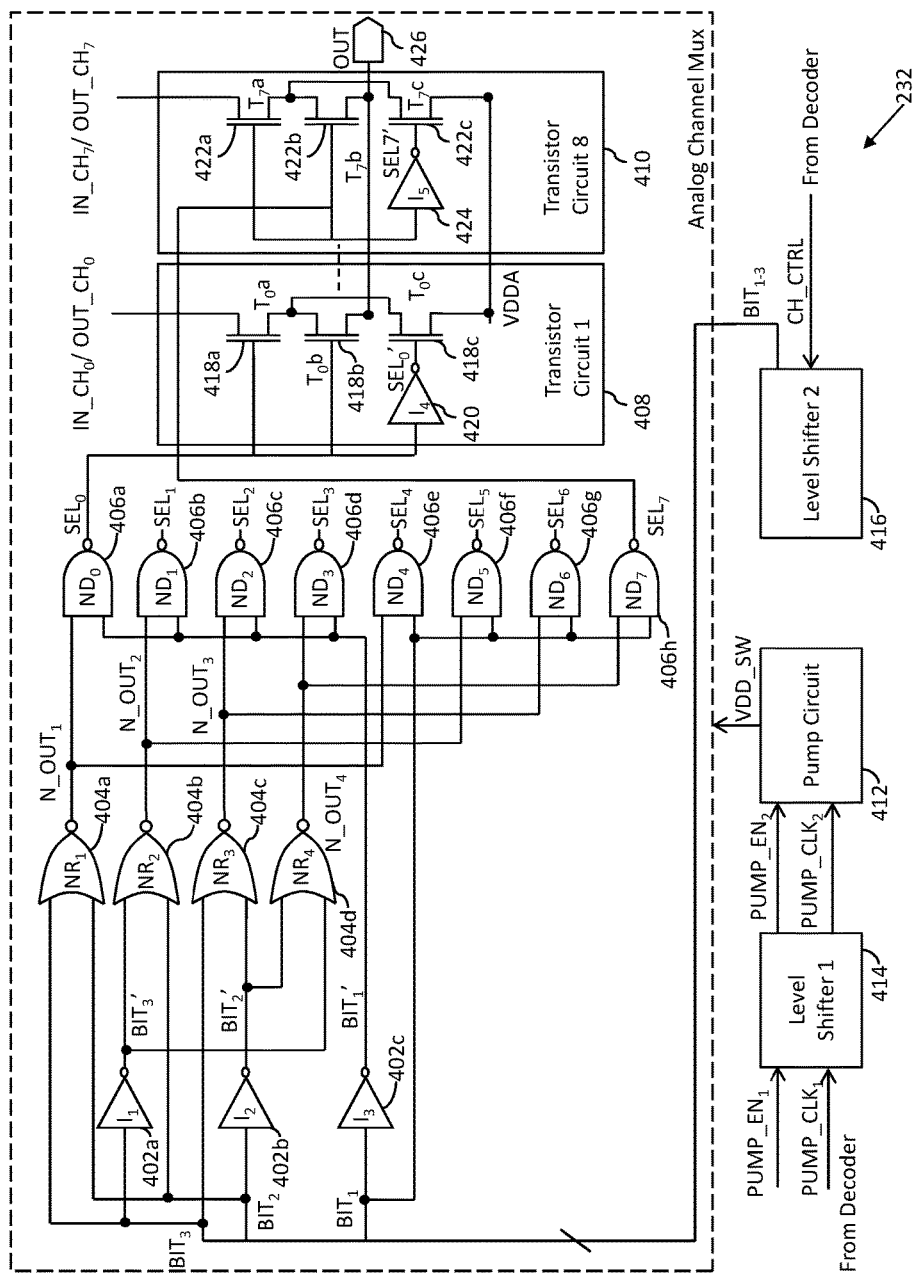
FIG. 4 is a schematic block diagram of an analog channel mux of a pin assignment circuit of the SoC of FIG. 2 in accordance with an embodiment of the present invention.

Referring now to FIG. 4, a schematic block diagram of the analog channel mux 232 of FIG. 2 in accordance with an embodiment of the present invention is shown. The analog channel mux 232 includes second through fourth NOT gates 402a-402c (collectively referred to as "NOT gates 402"), first through fourth NOR gates 404a-404d (collectively referred to as "NOR gates 404"), first through eighth NAND gates 406a-406h (collectively referred to as "NAND gates 406"), first through eighth transistor circuits (collectively referred to as "transistor circuits"), of which the first and eighth transistor circuits 408 and 410 are shown for illustrative purpose.

The analog channel mux 232 is further connected to a pump circuit 412. The pump circuit 412 provides a first operating voltage VDD_SW to the analog channel mux 232. First and second level shifters 414 and 416 are connected to the decoder 104. The first level shifter 414 receives a first pump enable signal $PUMP\_EN_1$ and a first pump clock signal $PUMP\_CLK_1$ from the decoder 104. The first level shifter 414 outputs a second pump enable signal $PUMP\_EN_2$ and a second pump clock signal $PUMP\_CLK_2$ to the pump circuit based on the first pump enable and pump clock signals $PUMP\_EN_1$ and $PUMP\_CLK_1$. The second pump enable signal $PUMP\_EN_2$ is a level shifted voltage version of the first pump enable signal $PUMP\_EN_1$. The second pump clock signal $PUMP\_CLK_2$ is a level shifted voltage version of the first pump clock signal $PUMP\_CLK_1$. The second pump enable signal $PUMP\_EN_2$ switches on the pump circuit 412. The second pump clock signal $PUMP\_CLK_2$ provides an operating clock for the pump circuit 412. The second level shifter 416 receives the channel control signal CH_CTRL from the decoder 104 and generates first through third channel control bits $BIT_1$-$BIT_3$ based on the channel control signal CH_CTRL. The number of bits of the channel control signal CH_CTRL is a logarithmic function of the number of analog device controllers 214. Since the SoC 100 includes eight device controllers 214, the number of bits of the channel control signal CH_CTRL is three ($Log_2(8)$). Thus, the second level shifter 416 generates the first through third channel control bits $BIT_1$-$BIT_3$.

The second NOT gate 402a is connected to the second level shifter 416, receives the third bit $BIT_3$ therefrom and generates an inverted third bit $BIT_3$'. The third NOT gate 402b is connected to the second level shifter 416, receives the second bit $BIT_2$ therefrom, and generates an inverted second bit $BIT_2$'. The fourth NOT gate 402c is connected to the second level shifter 416, receives the first channel control bit $BIT_1$ therefrom, and generates an inverted first channel control bit $BIT_1'$.

The first NOR gate 404a is connected to the second level shifter 416 and receives the third bit $BIT_3$ and the second bit $BIT_2$ therefrom and generates a first NOR output signal $N\_OUT_1$. The second NOR gate 404b is connected to the second NOT gate 402a and the second level shifter 416 and receives the inverted third bit $BIT_3'$ and the second bit $BIT_2$ from the second NOT gate 402a and the second level shifter 416, respectively. The second NOR gate 404b further generates a second NOR output signal $N\_OUT_2$. The third NOR gate 404c is connected to the third NOT gate 402b and the second level shifter 416 and receives the inverted second bit $BIT_2'$ and the third bit $BIT_3$ from the third NOT gate 402b and the second level shifter 416, respectively. The third NOR gate 402b further generates a third NOR output signal $N\_OUT_3$. The fourth NOR gate 404d is connected to the second and third NOT gates 402a and 402b and receives the inverted second bit $BIT_2'$ and the inverted third bit $BIT_3'$ from the third and second NOT gates 402b and 402a, respectively. The fourth NOR gate 404d further generates a fourth NOR output signal $N\_OUT_4$.

The first NAND gate 406a is connected to the first NOR gate 404a and the fourth NOT gate 402c, receives the first NOR output signal $N\_OUT_1$ and the inverted first channel control bit $BIT_1'$ from the first NOR gate 404a and the fourth NOT gate 402c, respectively, and further generates a first select signal $SEL_0$. The second NAND gate 406b is connected to the second NOR gate 404b and the fourth NOT gate 402c, receives the second NOR output signal $N\_OUT_2$ and the inverted first channel control bit $BIT_1'$ from the second NOR gate 404b and the fourth NOT gate 402c, respectively, and further generates a second select signal $SEL_1$. The third NAND gate 406c is connected to the third NOR gate 404c and the fourth NOT gate 402c, receives the third NOR output signal $N\_OUT_3$ and the inverted first channel control bit $BIT_1'$ from the third NOR gate 404c and the fourth NOT gate 402c, respectively, and further generates a third select signal $SEL_2$. The fourth NAND gate 406d is connected to the fourth NOR gate 404d and the fourth NOT gate 402c, receives the fourth NOR output signal $N\_OUT_4$ and the inverted first channel control bit $BIT_1'$ from the fourth NOR gate 404d and the fourth NOT gate 402c, respectively, and further generates a fourth select signal $SEL_3$.

The fifth NAND gate 406e is connected to the first NOR gate 404a and the second level shifter 416, receives the first NOR output signal $N\_OUT_1$ and the first channel control bit $BIT_1$ from the first NOR gate 404a and the second level shifter 416, respectively, and further generates a fifth select signal $SEL_4$. The sixth NAND gate 406f is connected to the second NOR gate 404b and the second level shifter 416, receives the second NOR output signal $N\_OUT_2$ and the first channel control bit $BIT_1$ from the second NOR gate 404b and the second level shifter 416, respectively, and further generates a sixth select signal $SEL_5$. The seventh NAND gate 406g is connected to the third NOR gate 404c and the second level shifter 416, receives the third NOR output signal $N\_OUT_3$ and the first channel control bit $BIT_1$ from the third NOR gate 404c and the second level shifter 416, respectively, and further generates a seventh select signal $SEL_6$. The eighth NAND gate 406h is connected to the fourth NOR gate 404d and the second level shifter 416, receives the fourth NOR output signal $N\_OUT_4$ and the first channel control bit $BIT_1$ from the fourth NOR gate 404d and the second level shifter 416, respectively, and further generates an eighth select signal $SEL_7$. The first transistor circuit 408 receives the first select signal $SEL_0$ from the first NAND gate 406a. The eighth transistor circuit 410 receives the eighth select signal $SEL_7$ from the eighth NAND gate 406h. The second through seventh transistor circuits (not shown) receive the second through seventh select signals $SEL_1$-$SEL_6$ from the second through seventh NAND gates 406b-406g, respectively. The first through eighth select signals $SEL_0$-$SEL_7$ form a one-hot code. A one-hot code is a set of bits in which only one bit of the set of bits is at high logic state and the remaining bits of the set of bits are at low logic state. Using the first through eighth select signals $SEL_0$-$SEL_7$ as a one-hot code facilitates the selection of only one channel input signal out of the first through eighth channel input signals $IN\_CH_0$-$IN\_CH_7$.

The first transistor circuit 408 includes first through third transistors 418a-418c and a fifth NOT gate 420. The fifth NOT gate 420 receives the first select signal $SEL_0$ from the first NAND gate 406a and generates an inverted first select signal $SEL_0'$. A source terminal of the first transistor 418a is connected to the third IO pad 206c and receives the first channel input signal $IN\_CH_0$ therefrom. A gate terminal of the first transistor 418a is connected to the first NAND gate 406a and receives the first select signal $SEL_0$ therefrom. A drain terminal of the first transistor 418a is connected to a source terminal of the second transistor 418b. A gate terminal of the second transistor 418b is connected to the first NAND gate 406a and receives the first select signal $SEL_0$ therefrom. A drain terminal of the second transistor 418b is connected to a source terminal of the third transistor 418c. A gate terminal of the third transistor 418c is connected to the fifth NOT gate 420 and receives the inverted first select signal $SEL_0'$. A drain terminal of the third transistor 418c receives a second operating voltage VDDA from a voltage source (not shown).

The eighth transistor circuit 410 includes fourth through sixth transistors 422a-422c and a sixth NOT gate 424. A source terminal of the fourth transistor 422a is connected to the fourth IO pad 206d and receives an eighth channel input signal $IN\_CH_7$ therefrom. A gate terminal of the fourth transistor 422a is connected to the eighth NAND gate 406h and receives the eighth select signal $SEL_7$ therefrom. A drain terminal of the fourth transistor 422a is connected to a source terminal of the fifth transistor 422b. A gate terminal of the fifth transistor 422b is connected to the eighth NAND gate 406h, and receives the eighth select signal $SEL_7$ therefrom. A drain terminal of the fifth transistor 422b is connected to a source terminal of the sixth transistor 422c. The sixth NOT gate 424 receives the eighth select signal $SEL_7$ from the eighth NAND gate 406h. The sixth NOT gate 424 outputs an inverted eighth select signal $SEL_7'$ to a gate terminal of the sixth transistor 422c. A drain terminal of the sixth transistor 422c receives the second operating voltage VDDA from the voltage source (not shown). The drain terminals of the second and the fifth transistors 418b and 422b are connected to an output terminal 426 for outputting one of the first through eighth channel input signals $IN\_CH_0$-$IN\_CH_7$.

In one embodiment, the first through third channel control bits $BIT_1$-$BIT_3$ are at a first logic state. Hence, the first NOR output signal $N\_OUT_1$ is at a second logic state. The second through fourth NOR output signals $N\_OUT_2$-$N\_OUT_4$ are at the first logic state. The first select signal $SEL_0$ is at the first logic state. The second through eighth select signals $SEL_2$-$SEL_7$ are at the second logic state. Hence, the gate terminals of the first and eighth transistors 418a and 418b are at the first logic state and the first and eighth transistors 418a and 418b conduct. Thus, the first and second transistors 418a and 418b output the first channel input signal IN_CH$_0$ to the output terminal 426. Since the second through eighth select signals SEL$_1$-SEL$_7$ are at the second logic state, the second through seventh transistor circuits (not shown) and the eighth transistor circuit 410 do not conduct.

In another embodiment, the first through third channel control bits BIT$_1$-BIT$_3$ are at the second logic state. Hence, the fourth NOR output signal N_OUT$_4$ is at the second logic state. The first through third NOR output signals N_OUT$_1$-N_OUT$_3$ are at the first logic state. The eighth select signal SEL$_7$ is at the first logic state. The first through seventh select signals SEL$_0$-SEL$_6$ are at the second logic state. Hence, the second transistor circuit 410 is active and outputs the eighth channel input signal IN_CH$_7$ to the output terminal 426.

Further, the analog device controllers 214 generate first through eighth channel output signals CH_OUT$_0$-CH_OUT$_7$. The analog channel mux 232 receives the first through eighth channel output signals OUT_CH$_0$-OUT_CH$_7$. In one instance, the analog channel mux 232 outputs the first channel output signal OUT_CH$_0$ to the third IO pad 206c based on the channel control signal CH_CTRL. The first analog device 218a receives the first channel output signal OUT_CH$_0$ from the third IO pad 206c. In another instance, the analog channel mux 232 outputs the eighth channel output signal OUT_CH$_7$ to the fourth IO pad 206d based on the channel control signal CH_CTRL. The second analog device 218b receives the eighth channel output signal OUT_CH$_7$ from the fourth IO pad 206d.

Thus, the first and eighth transistor circuits 408 and 410 receive the first and eighth channel output signals OUT_CH$_0$ and OUT_CH$_7$ from the first and eighth analog device controllers 214a and 214b, respectively, instead of the first and eighth channel input signals IN_CH$_0$ and IN_CH$_7$ from the first and eighth analog devices 218a and 218b. In one instance, the first through third channel control bits BIT$_1$-BIT$_3$ are at the first logic state. Hence, the first NOR output signal N_OUT$_1$ is at the second logic state. The second through fourth NOR output signals N_OUT$_2$-N_OUT$_4$ are at the first logic state. The first select signal SEL$_0$ is at the first logic state. The second through eighth select signals SEL$_2$-SEL$_7$ are at the second logic state. Hence, the gate terminals of the first and eighth transistors 418a and 418b are at the first logic state and the first and eighth transistors 418a and 418b conduct. Thus, the first and second transistors 418a and 418b output the first channel output signal OUT_CH$_0$ to the output terminal 426. Since the second through eighth select signals SEL$_1$-SEL$_7$ are at the second logic state, the second through seventh transistor circuits and the eighth transistor circuit 410 do not conduct.

In another instance, the first through third channel control bits BIT$_1$-BIT$_3$ are at the second logic state. Hence, the fourth NOR output signal N_OUT$_4$ is at the second logic state. The first through third NOR output signals N_OUT$_1$-N_OUT$_3$ are at the first logic state. The eighth select signal SEL$_7$ is at the first logic state. The first through seventh select signals SEL$_0$-SEL$_6$ are at the second logic state. Hence, the second transistor circuit 410 is active and outputs the eighth channel output signal OUT_CH$_7$ to the output terminal 426.

The SoC 100 includes the control register 102 for configuring the first through third pin assignment circuits 106a-106c. This eliminates the need for individual control registers for each of the first through third pin assignment circuits 106a-106d. Hence, the number of control registers used in the SoC 100 is less. The less number of control registers reduce the used area of the SoC 100 as compared to that of the conventional SoCs. Further, as the SoC 100 uses less number of registers, the SoC 100 is easy to manufacture and is not bulky. Moreover, the SoC 100 is less prone to overheating and functional errors. The SoC 100 can also include a higher number of the IO pads 108 as the area required by the control register 102 is lesser than the area required by individual control registers for each pin assignment circuit in the conventional SoC. Since the SoC 100 includes only one control register 102, only one C language command is used for configuring the control register 102 as compared to conventionally manufactured SoCs that use multiple C language commands for configuring multiple control registers. Thus, the processing load on the processor is reduced, thereby facilitating the processor to function efficiently.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

The terms first and second logic states have been used herein to distinguish before high and low signals. For example, the first logic state could signify a signal that is 0v while a second logic state would then indicate a signal that has a logical '1' value, with the actual voltage value for logic 1 depending on circuit technology. The circuits described herein also can be designed using either positive or negative logic, so an active signal in one embodiment could be a logic '0' and an inactive signal would then have a logic value of '1'.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system on chip (SOC) connected to a plurality of devices, wherein the devices generate a plurality of input bits, the SOC comprising:
   a control register that stores a configuration word that corresponds to the plurality of devices;
   a decoder connected to the control register for receiving the configuration word, and generating a plurality of pin-mux control bits based on the configuration word;
   a plurality of device controllers corresponding to the plurality of devices, wherein the device controllers generate a plurality of output bits to be transmitted to the plurality of devices;
   a set of IO pads connected to the plurality of devices, wherein each IO pad performs at least one of receiving one of the input bits and outputting one of the output bits; and
   a plurality of pin assignment circuits connected to the decoder for receiving the pin-mux control bits, wherein:
       the pin assignment circuits assign the IO pads of the set of IO pads to the devices based on the set of pin-mux control bits,
       the device controllers transmit the plurality of output bits to the corresponding ones of the devices of the plurality of devices by way of the assigned IO pads, and the devices transmit the plurality of input bits to the corresponding ones of the device controllers by way of the assigned IO pads, and each pin assignment circuit includes:
- a first multiplexer connected to the device controllers and the decoder, wherein the first multiplexer receives the output bits from the device controllers and a subset of the pin-mux control bits from the decoder, and outputs the output bits to corresponding IO pads of the set of IO pads based on the subset of the pin-mux control bits;
- a filter connected to the corresponding IO pads and the decoder, wherein the filter receives one or more of the input bits and the subset of the pin-mux control bits, respectively, and outputs one of a plurality of filtered input bits and the received one or more input bits, based on the subset of the pin-mux control bits; and
- a demultiplexer connected to the filter and the decoder, wherein the demultiplexer receives one or more of the input bits of the plurality of input bits, the one or more filtered input bits, and the subset of the set of pin-mux control bits, and outputs one of the one or more input bits and the one or more filtered input bits based on the subset of the set of pin-mux control bits.

2. The SOC of claim 1, wherein the filter comprises:
a first register, connected to a corresponding IO pad of the set of IO pads, wherein the first register receives the one or more input bits of the set of input bits and a clock signal, and stores the one or more input bits of the set of input bits;
a first logic gate, connected to the first register, wherein the first logic gate receives both the stored input bits from the register and the one more filtered input bits, and generates a first output bit;
a shift circuit connected to the first logic gate and the decoder, wherein the shift circuit receives the first output bit and the subset of the set of pin-mux control bits, respectively, and generates a first select signal;
a second logic gate connected to the first logic gate, wherein the second logic gate receives the one or more filtered input bits, and outputs one or more inverted, filtered input bits;
a second multiplexer connected to the second logic gate, wherein the second multiplexer receives the one or more filtered input bits and the one or more inverted filtered input bits, respectively, and outputs the one or more filtered input bits;
a second register connected to the second multiplexer, wherein the second register receives the one or more filtered input bits, and outputs the one or more filtered input bits, and the first logic gate receives the one or more filtered input bits from the second register; and
a third multiplexer connected to the corresponding IO pad of the set of IO pads, the second register, and the decoder, wherein the third multiplexer receives the one or more input bits of the set of input bits, the one or more filtered input bits, and the subset of the set of the pin-mux control bits, respectively, and outputs one of the one or more input bits of the set of input bits and the one or more filtered input bits based on the subset of the set of the pin-mux control bits.

3. The system on chip of claim 2, wherein:
the first logic gate is an XOR gate; and
the second logic gate is a NOT gate.

4. The system on chip of claim 3, further comprising:
a plurality priority multiplexers connected to the plurality of pin assignment circuits and the decoder, wherein:
the priority multiplexers receive the input bits from the pin assignment circuits and the subset of the set of pin-mux control bits; and
a selected one of the priority multiplexers is connected to a selected one of the device controllers and transmits an input bit of the one or more input bits to the selected device controller based on the subset of the set of pin-mux control bits.

5. The system on chip of claim 1, further comprising:
a plurality of analog channel multiplexers connected to the set of IO pads, the decoder, and a plurality of analog device controllers, wherein:
the set of analog channel multiplexers receives a set of output signals corresponding to a set of analog devices of the set of devices from the set of analog device controllers,
the set of analog channel multiplexers outputs the set of output signals to the set of analog devices by way of the set of IO pads,
the set of analog channel multiplexers receives a corresponding set of input signals from the set of analog devices by way of the corresponding set of IO pads,
the set of analog channel multiplexers outputs the set of input signals to the set of analog device controllers, and
each analog channel multiplexer of the set of analog channel multiplexers includes:
- a first set of logic gates connected to the decoder that receives a set of channel control bits, and generates a set of first logic output bits;
- a second set of logic gates connected to the first set of logic gates that receives the set of first logic output bits, and generates a set of second logic output bits;
- a third set of logic gates connected to the second set of logic gates that receives the set of second logic output bits, and generates a set of select bits; and
- a set of transistor circuits corresponding to the set of analog devices that is connected to the third set of logic gates, the set of analog devices, and the set of analog device controllers, receives the set of select bits from the third set of logic gates, and the set of output signals from the set of analog device controllers, and outputs an output signal of the set of output signals to a corresponding IO pad of the set of IO pads, wherein:
  a selected one of the transistor circuits receives a selected input signal from the analog device by way of the corresponding IO pad, and outputs the input signal to the analog device.

6. The system on chip of claim 5, wherein:
each logic gate of the first set of logic gates includes a NOT gate;
each logic gate of the second set of logic gates includes a NOR gate; and
each logic gate of the third set of logic gates includes a NAND gate.

7. A method for assigning one or more IO pads of a set of IO pads of a system on chip (SoC) to a subset of a set of devices, the method comprising:
storing a set of configuration words in a control register, wherein a configuration word of the set of configuration words corresponds to the subset of the set of devices;

receiving the configuration word from the control register by a decoder;

generating a set of pin-mux control bits by the decoder based on the configuration word;

transmitting the set of pin-mux control bits to a set of pin assignment circuits by the decoder;

assigning one or more IO pads of the set of IO pads to the subset of the set of devices by the set of pin assignment circuits based on the set of pin-mux control bits, wherein the set of IO pads corresponds to the set of pin assignment circuits;

generating a set of output bits by a set of device controllers corresponding to the subset of the set of devices;

transmitting an output bit of the set of output bits by a device controller of the set of device controllers by way of the one or more IO pads of the set of IO pads to a device of the subset of the set of devices; and transmitting an input bit of a set of input bits by the device of the subset of the set of devices by way of the one or more IO pads of the set of IO pads to the corresponding device controller, wherein each device of the set of devices generates a corresponding input bit of the set of input bits.

8. The method of claim 7, further comprising:

receiving the set of output bits and a subset of the set of pin-mux control bits from the set of device controllers and the decoder, respectively, by a first multiplexer of a set of multiplexers, wherein:
  the set of multiplexers corresponds to the set of IO pads, and
  the set of pin assignment circuits includes the corresponding set of multiplexers; and outputting the output bit of the set of output bits to the corresponding IO pad of the set of IO pads, wherein the output bit of the set of output bits corresponds to the device controller of the set of device controllers.

9. The method of claim 8, further comprising:

receiving one or more input bits of the set of input bits and the subset of the set of pin-mux control bits from a filter of the set of filters and the decoder, respectively, by a demultiplexer of a set of demultiplexers, wherein the set of pin assignment circuits includes:
  the corresponding set of demultiplexers, and
  the corresponding set of filters; and outputting one of the one or more input bits of the set of input bits and one or more filtered input bits by the demultiplexer of the set of demultiplexers based on the subset of the set of pin-mux control bits.

10. The method of claim 9, further comprising:

receiving the one or more input bits of the set of input bits from the corresponding IO pad of the set of IO pads by the filter of the set of filters; and generating the one or more filtered input bits from the one or more input bits by the filter of the set of filters.

11. The method of claim 10, wherein the filter of the set of filters is configured for:

receiving the one or more input bits of the set of input bits from the IO pad of the set of IO pads by a first register;

storing the one or more input bits in the first register;

outputting the one or more input bits of the set of input bits by the first register;

receiving the one or more input bits of the set of input bits and the one or more filtered input bits from the first register and a second register, respectively, by a first logic gate;

generating a first output bit by the first logic gate;

receiving the first output bit and the subset of the set of pin-mux control bits from the first logic gate and the decoder, respectively, by a shift circuit;

generating a first select signal by the shift circuit;

receiving the one or more filtered input bits and one or more inverted filtered input bits from the second register and a second logic gate, respectively, by a second multiplexer, wherein the second logic gate receives the one or more filtered input bits from the second register;

outputting the one or more filtered input bits by the second multiplexer, wherein the second register receives the one or more filtered input bits;

receiving the one or more input bits, the one or more filtered input bits, and the subset of the set of pin-mux control bits from the corresponding IO pad of the set of IO pads, the second register, and the decoder, respectively, by a third multiplexer; and outputting at least one of the one or more filtered input bits and the one or more input bits of the set of input bits by the third multiplexer based on the subset of the set of pin-mux control bits.

12. The method of claim 11, further comprising:

receiving the one or more input bits and the subset of the set of pin-mux control bits from at least one pin assignment circuit of the set of pin assignment circuits and the decoder, respectively, by a set of priority muxes, wherein a priority mux of the set of priority muxes is connected to a device controller of the set of device controllers; and transmitting an input bit of the one or more input bits to the device controller of the set of device controllers by the priority multiplexer of the set of priority multiplexers based on the subset of the set of pin-mux control bits.

13. A system on a chip (SOC) connected to a set of devices, comprising:

a control register that stores a set of configuration words, wherein a configuration word of the set of configuration words corresponds to a subset of the set of devices, and wherein the set of devices generates a corresponding set of input bits;

a decoder connected to the control register, wherein the decoder receives the configuration word, and generates a set of pin-mux control bits based on the configuration word;

a set of device controllers, corresponding to the set of devices, wherein the set of device controllers generates a corresponding set of output bits;

a set of IO pads connected to the set of devices, wherein each IO pad of the set of IO pads performs one of inputting and outputting bits of the sets of input and output bits, respectively; and a set of pin assignment circuits connected to the decoder and receiving the set of pin-mux control bits therefrom, wherein:
  the set of pin assignment circuits assigns one or more IO pads of the set of IO pads to the subset of the set of devices based on the set of pin-mux control bits,
  the set of pin assignment circuits corresponds to the set of IO pads,
  a device controller of the set of device controllers transmits an output bit of the set of output bits to a corresponding device of the subset of the set of devices by way of the one or more IO pads of the set of IO pads, and
  the device of the subset of the set of devices transmits an input bit of the set of input bits to the corresponding device controller of the set of device controllers by way of the one or more IO pads of the set of IO pads.

14. The SOC of claim 13, wherein each pin assignment circuit includes:
a first multiplexer connected to the set of device controllers and the decoder, wherein the first multiplexer:
receives the set of output bits and a subset of the set of pin-mux control bits, and
outputs the output bit of the set of output bits to a corresponding IO pad of the set of IO pads based on the subset of the set of pin-mux control bits;
a filter connected to the corresponding IO pad of the first multiplexer, and the decoder, wherein the filter receives one or more input bits of the set of input bits and the subset of the set of pin-mux control bits, respectively, and outputs at least one of one or more filtered input bits and the one or more input bits of the set of input bits based on the subset of the set of pin-mux control bits; and
a demultiplexer connected to the filter and the decoder, wherein the demultiplexer:
receives at least one of the one or more input bits of the set of input bits and the one or more filtered input bits and the subset of the set of pin-mux control bits, and
outputs at least one of the one or more input bits of the set of input bits and the one or more filtered input bits based on the subset of the set of pin-mux control bits.

15. The SOC of claim 14, wherein the filter comprises:
a first register connected to the corresponding IO pad of the first multiplexer, wherein the first register:
receives the one or more input bits of the set of input bits and a clock signal, and
outputs the one or more input bits of the set of input bits;
a first logic gate connected to the first register and a second logic gate, wherein the first logic gate receives the one or more input bits of the set of input bits and the one more filtered input bits, respectively, and generates a first output bit;
a shift circuit connected to the first logic gate and the decoder, wherein the shift circuit receives the first output bit and the subset of the set of pin-mux control bits, respectively, and generates a first select signal;
a second logic gate that receives the one or more filtered input bits and outputs one or more inverted filtered input bits;
a second multiplexer mux connected to the second logic gate, wherein the second multiplexer:
receives the one or more filtered input bits and the one or more inverted filtered input bits, respectively, and outputs the one or more filtered input bits;
a second register connected to the second multiplexer, wherein the second register receives the one or more filtered input bits, and outputs the one or more filtered input bits to the first logic gate; and
a third multiplexer connected to the corresponding IO pad of the first multiplexer, the second register, and the decoder, wherein the third multiplexer:
receives the one or more input bits of the set of input bits, the one or more filtered input bits, and the subset of the set of the pin-mux control bits, respectively, and outputs one of the one or more input bits of the set of input bits and the one or more filtered input bits based on the subset of the set of the pin-mux control bits.

16. The SOC of claim 15, wherein the first logic gate is an XOR gate, and the second logic gate is a NOT gate.

17. The SOC of claim 16, further comprising:
a set of priority multiplexers connected to the set of pin assignment circuits and the decoder, wherein:
the set of priority multiplexers receives the one or more input bits of the set of input bits from at least one pin assignment circuit of the set of pin assignment circuits and the subset of the set of pin-mux control bits; and
a priority multiplexer of the set of priority multiplexers is connected to the device controller of the set of device controllers and transmits an input bit of the one or more input bits of the set of input bits to the device controller based on the subset of the set of pin-mux control bits.

18. The SOC of claim 13, further comprising:
a set of analog channel multiplexers connected to the set of IO pads, the decoder, and a set of analog device controllers that receives a set of output signals corresponding to a set of analog devices of the set of devices, and outputs the set of output signals to the corresponding set of analog devices by way of the set of IO pads, wherein the set of analog channel multiplexers receives a corresponding set of input signals from the set of analog devices by way of the corresponding set of IO pads, and outputs the set of input signals to the set of analog device controllers, and wherein each analog channel multiplexer of the set of analog channel multiplexers includes:
a first set of logic gates connected to the decoder that receives a set of channel control bits, and generates a set of first logic output bits;
a second set of logic gates connected to the first set of logic gates that receives the set of first logic output bits, and generates a set of second logic output bits;
a third set of logic gates connected to the second set of logic gates that receives the set of second logic output bits, and generates a set of select bits; and
a set of transistor circuits corresponding to the set of analog devices that is connected to the third set of logic gates, the set of analog devices, and the set of analog device controllers, receives the set of select bits, and outputs an output signal of the set of output signals to a corresponding IO pad of the set of IO pads, wherein a transistor circuit of the set of transistor circuits receives an input signal of the set of input signals by way of the corresponding IO pad, and outputs the input signal.

19. The SOC of claim 18, wherein:
each logic gate of the first set of logic gates includes a NOT gate;
each logic gate of the second set of logic gates includes a NOR gate; and
each logic gate of the third set of logic gates includes a NAND gate.

20. The SOC of claim 13, wherein each device of the set of devices comprises one of a random access memory (RAM), a keypad, a universal serial bus (USB), a camera, an Ethernet peripheral device, a digital-to-analog converter (DAC), and an analog-to-digital converter (ADC).

* * * * *